US 10,243,458 B2

(12) United States Patent
Stoeger

(10) Patent No.: US 10,243,458 B2
(45) Date of Patent: Mar. 26, 2019

(54) METHOD AND APPARATUS FOR HYSTERESIS REGULATION OF THE OUTPUT VOLTAGE OF A DC-TO-DC CONVERTER

(71) Applicant: CONTINENTAL AUTOMOTIVE GMBH, Hannover (DE)

(72) Inventor: Christian Stoeger, Vienna (AT)

(73) Assignee: Continental Automotive GmbH, Hannover (DE)

( * ) Notice: Subject to any disclaimer, the term of this patent is extended or adjusted under 35 U.S.C. 154(b) by 588 days.

(21) Appl. No.: 14/652,889

(22) PCT Filed: Nov. 14, 2013

(86) PCT No.: PCT/EP2013/073784
§ 371 (c)(1),
(2) Date: Jun. 17, 2015

(87) PCT Pub. No.: WO2014/095172
PCT Pub. Date: Jun. 26, 2014

(65) Prior Publication Data
US 2015/0333625 A1 Nov. 19, 2015

(30) Foreign Application Priority Data
Dec. 17, 2012 (DE) .......................... 10 2012 223 452

(51) Int. Cl.
H02M 3/156 (2006.01)
G01R 31/40 (2014.01)
(Continued)

(52) U.S. Cl.
CPC .......... *H02M 3/156* (2013.01); *G01R 19/165* (2013.01); *G01R 31/40* (2013.01); *H02M 3/1563* (2013.01); *H05B 33/0815* (2013.01)

(58) Field of Classification Search
CPC .... H02M 3/156; H02M 3/1563; H02M 3/157; G01R 31/40; G01R 19/165; H05B 33/0815
(Continued)

(56) References Cited

U.S. PATENT DOCUMENTS

| 7,053,595 B1* | 5/2006 | Mei ....................... | H02M 3/156 323/283 |
| 2007/0103126 A1* | 5/2007 | McDonald .......... | H02M 3/1563 323/271 |
| 2011/0121797 A1* | 5/2011 | Daniel ................ | H02M 3/1563 323/265 |

OTHER PUBLICATIONS

S. Buso, S. Fasolo, L. Malesani and P. Mattavelli, "A dead-beat adaptive hysteresis current control," in IEEE Transactions on Industry Applications, vol. 36, No. 4, pp. 1174-1180, Jul./Aug. 2000.*
(Continued)

*Primary Examiner* — Jue Zhang
*Assistant Examiner* — Jye-June Lee
(74) *Attorney, Agent, or Firm* — Laurence A. Greenberg; Werner H. Stemer; Ralph E. Locher

(57) ABSTRACT

A method and a device for monitoring the output current from a DC static converter. The monitoring device has a switching device for switching a switch on the DC static converter, in accordance with a hysteresis regulation of the output current from a DC static converter within a hysteresis range defined by a lower limit value and an upper limit value. A switch on the DC static converter is switched by the switching device when the value passes out of the hysteresis range and at least one limit value is modified to compensate for switching delays by way of a compensating circuit connected to the switching device.

20 Claims, 3 Drawing Sheets

(51) Int. Cl.
*G01R 19/165* (2006.01)
*H05B 33/08* (2006.01)

(58) Field of Classification Search
USPC .......................................... 323/265, 271, 283
See application file for complete search history.

(56) References Cited

OTHER PUBLICATIONS

Kelvin Ka-Sing Leung and Henry Shu-Hung Chung, "Dynamic hysteresis band control of the buck converter with fast transient response," in IEEE Transactions on Circuits and Systems II: Express Briefs, vol. 52, No. 7, pp. 398-402, Jul. 2005.*

C. L. Wey, Z. Y. Li, K. C. Chang, G. N. Sung and D. K. Wey, "A fast hysteretic buck converter with adaptive ripple controller," 2012 IEEE 55th International Midwest Symposium on Circuits and Systems (MWSCAS), Boise, ID, 2012, pp. 1156-1159.*

* cited by examiner

METHOD AND APPARATUS FOR HYSTERESIS REGULATION OF THE OUTPUT VOLTAGE OF A DC-TO-DC CONVERTER

BACKGROUND OF THE INVENTION

Field of the Invention

The invention relates to a method and an apparatus for hysteresis regulation of the output voltage of a DC-to-DC converter within a hysteresis range defined by a lower limit value and an upper limit value, wherein a switch of the DC-to-DC converter is switched over on a departure from the hysteresis range.

When using DC-to-DC converters for constant current supply to variable loads, regulation is indispensable in order to be able to match the output voltage of the converter to the changing load resistance. Typical current controllers, for example PI controllers, can compensate for slow effects, such as temperature-dependent or aging-dependent effects, and under certain circumstances can compensate slowly for relatively fluctuating input voltages with quickly variable loads, as occur in the case of LED groups, for example, but, owing to the slow response of the integration loop, cannot avoid them and generate overcurrents or undercurrents, which can result in a flickering light, for example.

An approach with much more promise of success in this case consists in hysteresis regulation as mentioned above which influences the switch behavior of the converter in order to provide an output voltage corresponding to the changed load and therefore the desired current. The time between two switching operations of the converter is in this case dependent on the measured output voltage and can change from cycle to cycle. As a result, a fairly constant current can be supplied even to consumers having a dynamically and very quickly changing load.

A disadvantage with such regulation consists in that the switchover time is dependent not only on the output voltage, but also on the current and on other parameters, such as delays of comparators, the gate voltage of the FET switch of the converter, the intensity of the gate driver etc. For this reason, nine times out of ten overshoots and undershoots occur in the case of the output voltage, wherein the amplitude of the overshoots and undershoots is dependent on the switching time and on the increase or drop in the current. Both an increase and a drop in the current are in turn dependent on the difference between the input and output voltage, however, which both fluctuate. A discrepancy between the average current and preset value is therefore virtually unavoidable.

BRIEF SUMMARY OF THE INVENTION

One object of the invention consists in proposing an economic solution for regulation which enables compensation of all of the voltage-dependent and time-dependent effects. The invention is also intended to be used for a broad output current range and can provide flexible, under certain circumstances very fluctuating output voltages. It would furthermore be desirable for the influence of fluctuations in the input voltage and of changing supply levels at the input to be as small as possible. Apart from this, the input current should not increase or decrease too quickly in order not to destroy any converters connected upstream. Finally, a mode of operation which is largely unimpaired by temperature and aging influences should be provided.

The method according to the invention of the type mentioned at the outset achieves this object in that at least one limit value is changed in order to compensate for switching delays.

In the case of the corresponding device according to the invention, at least one compensation circuit for changing a limit value is connected to the switching means in a corresponding manner in order to achieve the mentioned object.

In contrast to the known regulation using a fixed hysteresis range, in the present method or in the present device the hysteresis range for compensating for the overshoots and undershoots is adapted by virtue of one of the limit values or both limit values being changed. Owing to such a change, the effective switching time of the regulated converter can be corrected indirectly: a change in a limit value which reduces the size of the hysteresis range corresponds to a tendentially earlier switching time, based on the predecessor. An increase in the hysteresis range, on the other hand, generally results in a lower switching frequency.

In order to achieve the desired compensation without increasing the original switching frequency, it is favorable if in the event of an exit of the output voltage from the hysteresis range, the limit value which is opposite an exit side is changed symmetrically with the exit. Owing to the hysteresis regulation, therefore, an average value which is as constant as possible can be achieved since the "delayed" switching time responsible for the exit is compensated for by an intentionally introduced delay on the opposite side of the hysteresis range. The ripple of the output voltage is thus overall increased but at the same time the discrepancies between the average value and the preset value are considerably reduced.

In the device according to the invention, correspondingly a compensation circuit for reducing the lower limit value and a compensation circuit for raising the upper limit value can be provided.

Particularly quick compensation of voltage-dependent and time-dependent effects can be achieved if, in the event of a departure from the hysteresis range, the lower limit value is reduced corresponding to the extent of overshooting of the upper limit value and/or the upper limit value is raised corresponding to the extent of undershooting of the lower limit value. In this case, compensation is achieved already after half a switching period, for example, i.e. at the following switching time.

In order to enable suitable compensation matched to the fluctuation amplitude and change in the limit value, the extent of overshooting or undershooting can be recorded in a storage element, in particular in a respectively associated capacitor. Therefore, in order to determine the changed limit value, the recorded value is used if required at a later time and this recorded value can be subtracted from a preset limit value, for example. In this case, clearing the storage element does not result in the loss of all of the limit values, but only the change recorded in the storage element is deleted.

In the device according to the invention, it is advantageous in this context if the respective compensation circuit has recording circuits, which are assigned to the lower limit value and to the upper limit value, respectively.

A simple implementation of the recording circuits can be achieved, for example, by virtue of the fact that each recording circuit has a capacitor and a diode, which is connected in series with the capacitor. In this case, the diode firstly sets the mathematical sign of the charging operation, i.e. whether the capacitor is charged in the case of overshooting or undershooting of the respective limit value, and also ensures that the capacitor maintains its charge after the switching operation of the converter.

It is furthermore advantageous if each recording circuit has a compensation amplifier for converting the voltage present at the capacitor into a current, wherein discharge of the capacitor is substantially avoided.

As regards the storage element, it has proven to be advantageous if said storage element is reset periodically, preferably on renewed entry of the output voltage into the hysteresis range. By virtue of resetting, resonance effects, i.e. escalation of the changes in limit value to ever higher amplitudes, can be prevented. The time for resetting should in any case not be before the actual switching times since an opposite storage element (assigned to the respective other side) can be updated corresponding to the overshoot or undershoot until this time. The reentry into the hysteresis range is an easily identifiable time which is in any case after the switching time prior to any exit from the hysteresis range on the respective opposite side.

In the case of the present device, the corresponding function can be achieved by virtue of the fact that the recording circuit has a resetting switch for discharging the capacitor. The resetting switch is in this case connected in parallel with the capacitor, so that a closed resetting switch brings the charge of the capacitor and therefore the voltage across the capacitor to zero. For this, a time window which is short relative to the period of the converter is already sufficient since the discharge begins almost immediately.

In order that the recording circuit can again maintain charge later, the resetting switch needs to be opened again after successful discharge of the respective capacitor. For this reason, it is favorable if the resetting switch of the recording circuit assigned to the lower limit value is connected to a switching means for signaling an overshoot of the upper limit value via a pulse generator, and the resetting switch of the recording circuit assigned to the upper limit value is connected to a switching means for signaling an undershoot of the lower limit value via a pulse generator. The duration of the pulses generated by the pulse generators in this case needs to be sufficient to achieve complete discharge of the capacitors but should under no circumstances be so long that the respective resetting switch is opened again, under certain circumstances not at the correct time, i.e. prior to the next exit from the hysteresis range.

In order that the most favorable discharge time is achieved in the case of the present device, advantageously the pulse generators can be each designed to temporarily, preferably for approximately 10 ns, close the respectively assigned resetting switch, preferably after a certain delay, on reentry of the output voltage into the hysteresis range.

In detail, the essential method steps of a cycle or a period of the preferred method according to the invention, beginning with a decreasing output voltage within the hysteresis range, can be summarized as follows:
  a) in the case of undershooting of the lower limit value an undershoot signal is set and closing of the switch of the DC-to-DC converter is initiated;
  b) during a delay in the switching operation, a minimum-level capacitor is charged via a diode corresponding to the difference between the output voltage and the lower limit value;
  c) the value thus achieved of the minimum-level capacitor is added by the upper limit value and the upper limit value is raised corresponding to the voltage difference;
  d) the minimum-level capacitor maintains its charge after the switching operation and during the subsequent increase in the output voltage owing to the diode and the upper limit value remains offset upward correspondingly;
  e) in the case of an overshoot of the lower limit value, the undershoot signal set in step a) is reset;
  f) on overshooting of the upper limit value, an overshoot signal is set and opening of the switch of the DC-to-DC converter is initiated;
  g) during a delay in the switching operation, a maximum-level capacitor is charged via a diode corresponding to the difference between the upper limit value and the output voltage;
  h) the thus achieved value of the maximum-level capacitor is subtracted from the lower limit value and the lower limit value is reduced corresponding to the voltage difference;
  i) the maximum-level capacitor maintains its charge after the switching operation and during the subsequent reduction in the output voltage owing to the diode and the lower limit value remains offset downward correspondingly;
  j) in the event of an undershoot of the upper limit value, finally the overshoot signal set in step f) is reset.

In the outlined method, the minimum-level capacitor and the maximum-level capacitor each corresponds to a storage element.

If the storage elements, as is explained further above, are intended to be reset periodically, in the described method in each case one intermediate step can be inserted, wherein
  e1) on resetting of the undershoot signal, discharge of the maximum-level capacitor is initiated and the lower limit value is raised to the original value; or
  j1) on resetting of the overshoot signal, discharge of the minimum-level capacitor is initiated and the upper limit value is reduced to the original value.

A simple and economic implementation of the present device consists in that an average current sink presets a reference value, and limit values are preferably preset by two substantially identical half-wave sources, wherein the average current sink is connected directly to the measurement means and relates the measured output voltage to the reference value, and wherein the half-wave sources are connected to the measurement means and to the average current sink via voltage-divider resistors, with the result that comparison voltages for identifying an exit of the output voltage from the hysteresis range are present at the nodes adjacent to the voltage-divider resistors. In order to avoid high losses and to keep the heat emitted low, the average current sink can take up approximately a thousandth of the output current, for example. The measurement means would in this case be configured to output current scaled correspondingly with respect to the output current. The two half-wave sources define the limit values relative to the center point or reference value fixed by the average current sink and therefore the original hysteresis range. Said half-wave sources should be matched precisely since an error in the matching would result in a shift in the average value of the output current achieved.

In a particularly favorable variant of the present device, the measurement means and switching means including the compensation circuits and any components connected there between are accommodated in an integrated circuit, wherein preferably a shunt for measuring the current across the DC-to-DC converter and/or a switch, in particular a FET, for switching off/on a voltage at a converter inductance are likewise integrated. This design enables simple integration in existing converter concepts owing to the low number of component parts and the small space requirement.

BRIEF DESCRIPTION OF THE SEVERAL VIEWS OF THE DRAWING

The invention will be explained in more detail below with reference to particularly preferred exemplary embodiments, to which the invention is not restricted, however, and with reference to the drawing, in which, specifically.

DESCRIPTION OF THE INVENTION

Figure 1:
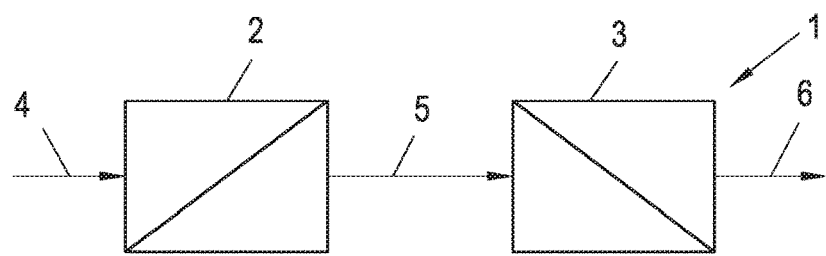
FIG. 1 shows a schematic block circuit diagram of a DC-to-DC converter cascade for supplying power to an LED group.

FIG. 1 shows the basic design of a typical application scenario of the method according to the invention or the apparatus. What is involved here is a cascade 1 of DC-to-DC converters 2, 3 comprising a boost converter 2 and a buck converter 3. The boost converter 2 is connected to a "vehicle electrical distribution" system voltage 4, which it converts into a higher supply voltage 5. The buck converter 3 or in general a plurality of buck converters are connected to the supply voltage 5 provided and, from this, generate a preset output current 6. The output voltage of the buck converter 3 is therefore regulated to the extent that it effects the predefined output current 6 depending on the connected load resistance (not depicted).

Figure 2:
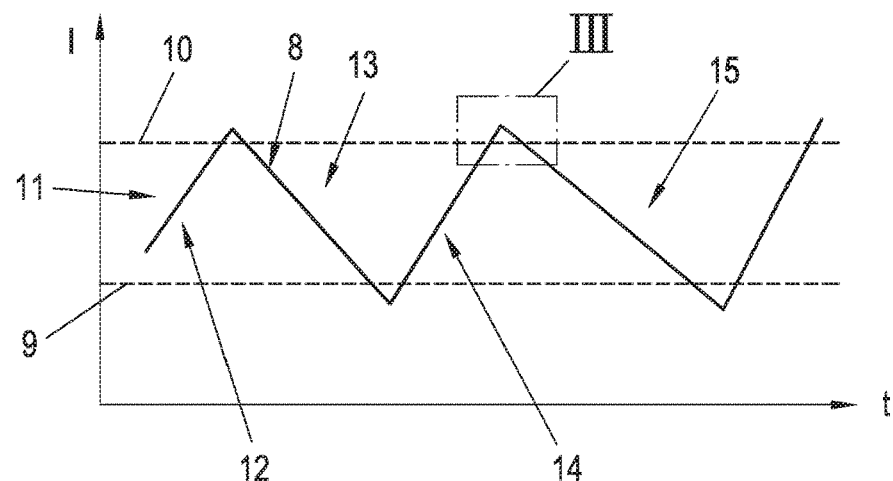
FIG. 2 shows a graph of the current profile for a hysteresis controller in accordance with the prior art.

The DC-to-DC converters 2, 3 have, in a manner which is known per se and therefore is not shown or described in any more detail, a substantially periodically operated switch (cf. switch 7 in FIG. 5) and one or more energy stores. The desired output voltage or the desired output current 6 of the buck converter 3 is achieved by corresponding setting or regulation of the charging and discharge cycles of the energy store. A profile 8 of the output current 6 of a corresponding hysteresis controller known from the prior art is illustrated in FIG. 2. The x axis t is a time axis, wherein the scale is selected such that approximately two full charging/discharge cycles of the energy store are shown. The output current 6 of the regulated converter 3 is plotted on the y axis I, wherein the two horizontal dashed lines 9, 10 indicate a lower limit value 9 and an upper limit value 10 of the output current 6. The range between the two limit values 9, 10 is the hysteresis range 11. The preset value of the output current 6 should generally be in the center of the hysteresis range 11 between the two limit values 9, 10.

The illustrated current profile 8 begins with a charging segment 12. As soon as the output current 6 overshoots the upper limit value 10, the charging segment 12 is ended and a discharge segment 13 begins. In this case, owing to a switching delay Δt (cf. FIG. 3), there is often an overshoot of the upper limit value 10. The same applies similarly to the undershoot of the lower limit value 9. In this case, as soon as the output current 6 reaches the lower limit value 9, the discharge segment 13 is ended and a new charging segment 14 is begun. The average value of the output current 6 over one or more cycles should correspond to the preset value. This aim can in this case only be achieved when the overshoots and undershoots of the two limit values 10, 9 in one cycle are identical. However, this is not the case in practice since, for example, fluctuations in the supply voltage 5 and the load resistance contribute to constantly and quickly changing conditions.

Figure 3:
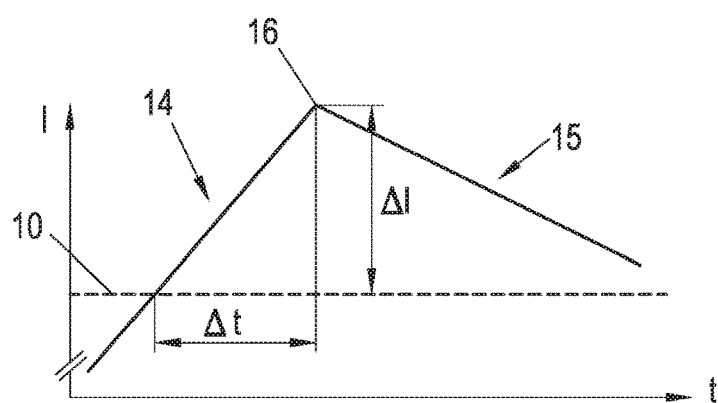
FIG. 3 shows a detail from FIG. 2, in accordance with the region III in FIG. 2.

The transition from the second charging segment 14 to the second discharge segment 15 is indicated in FIG. 2 by the rectangular region III and illustrated in detail in FIG. 3. The graph axes t, I are correspondingly identical to those in FIG. 2. The horizontal dashed line indicates the upper limit value 10 of the output current 6. It is clearly visible here that the switchover from the charging segment 14 to the discharge segment 15 does not take place immediately when the limit value 10 is reached, but only after a switching delay Δt. Since the energy store of the buck converter 3 continues to be charged during time Δt, the output current 6 also continues to increase. At the reversal point 16 between the charging segment 14 and the discharge segment 15, the output current 6 reaches a value which is above the upper limit value 10 by a differential ΔI. After the reversal point 16, only the extent ΔI of the overshoot needs to be discharged during the discharge segment 15 before the output current 6 is again within, i.e. in this case below, the upper limit value 10.

As can be seen from FIGS. 2 and 3, the gradients of the charging segment 14 and the discharge segment 15 are generally different. A constant switching delay Δt therefore results in different current differences ΔI, wherein the difference ΔI is greater the greater the gradient of the delayed segment 14, 15 (wherein this of course also applies with the negative mathematical sign, i.e. in the region of the lower limit value 9). In addition to the changing supply voltage 5 and the changing load, this effect likewise contributes to the fluctuations in the difference ΔI. In addition, even slower changes, for example owing to temperature influences or aging phenomena, also need to be taken into consideration. Without additional regulation or compensation, the average value of the current 6 generated by the buck converter 3 often deviates significantly from the preset value under the listed influences.

Figure 4:
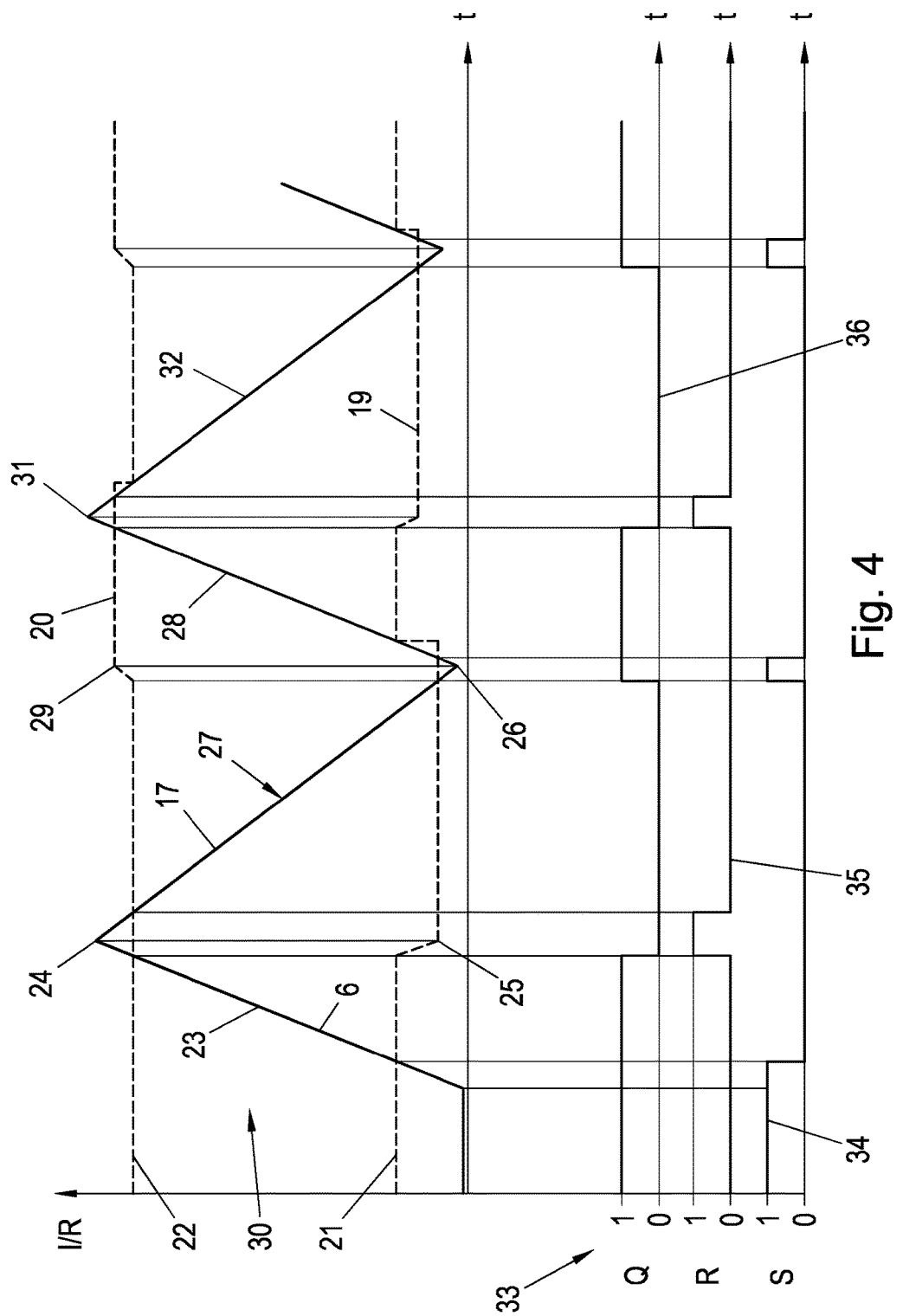
FIG. 4 shows a graph of a voltage profile and of the generated switching signals in the case of regulation in accordance with the present method.

FIG. 4 shows a current profile 17 and a voltage profile across a shunt 18 (cf. FIG. 5) in the case of current regulation in accordance with the present method. In contrast to FIG. 2, in this case the limit values 19, 20 change as a function of time t. The dashed lines representing the lower and upper limit values 19, 20 have a varying, generally step-shaped profile, wherein the lower limit value 19 returns periodically to a lower base value 21 and the upper limit value 20 returns periodically to an upper base value 22. In the meantime, the limit values 19, 20 are changed in accordance with the present method: as soon as the output current 6 reaches the upper limit value 20, the lower limit value 19 begins to decrease symmetrically with the further increasing output current 6, corresponding to the extent of the overshoot. If a charging segment 23 ends and the output current 6 or the profile 17 thereof reaches a maximum 24, the lower limit value 19 correspondingly reaches a minimum 25. The lower limit value 19 remains at this minimum 25 even when the output current 6 is already decreasing again.

In accordance with the known regulation principle, the output current 6 decreases thereafter until it reaches the (changed) lower limit value 19, i.e. the value of the minimum 25. As soon as the output current 6 decreases below the lower limit value 19, the upper limit value 20 is raised symmetrically with the profile 17 of the decreasing output current 6, similarly to the change in the lower limit value 19. The output current 6 reaches a minimum 26 when the discharge segment 27 is ended, and the subsequent charging segment 28 begins. The maximum 29 achieved by the upper limit value 20 at this time is stored during the charging segment 28. As soon as the output current 6 overshoots the lower limit value 19 during the charging segment 28, the lower limit value 19 is reset or raised to the lower base value 21. The lower limit value 19 remains there while the output current 6 traverses the hysteresis range 30. Only when the output current 6 overshoots the upper (now changed) limit value 20 or in this case the value of the maximum 29 again is the lower limit value 19 decreased again, as explained. In the same way, the upper limit value 20 is reset or reduced to the upper base value 22 once the output current 6 decreases back below the upper limit value 20 after a maximum 31 during a discharge segment 32. The lower part 33 of FIG. 4 illustrates the signals S, R, Q associated with the described operations (cf. also FIG. 5) or the time profile thereof. Specifically, the lowermost line 34 represents an undershoot signal S ("set"), the central line 35 represents an overshoot signal R ("reset"), and the uppermost line 36 represents a control signal Q. The control signal Q is applied to the switch 7 (cf. FIG. 5) of the buck converter 3 (cf. FIG. 1), wherein a delay between a change in the control signal Q and switchover of the switch 7 does need to be taken into consideration, however. All of the three signals Q, R, S are binary and therefore each only assumes the value 0 or 1 or "off" or "on". In the text which follows, "setting" of a signal means that it assumes the value 1/on and "resetting" of a signal means that it assumes the value 0/off.

At the beginning of the sequence illustrated, the output current 6 is lower than the lower limit value 19 and therefore the undershoot signal S is set and the overshoot signal R is reset. When the undershoot signal S is set, the control signal Q is always also set, in accordance with the method. As soon as the output current 6 overshoots the lower limit value 19, the undershoot signal S is reset. The resetting of the undershoot signal S or of the overshoot signal R has no direct influence on the control signal Q, which therefore maintains its state (on). Therefore, the switch 7 of the buck converter 3 remains closed, the output current 6 continues to increase and the overshoot signal R remains reset. As soon as the output current 6 overshoots the upper limit value 20, the overshoot signal R is set and, in accordance with the method, the control signal Q is thus reset. Owing to the delay between the control signal Q and the state of the switch 7, the current 6 continues to increase during the delay and only begins to decrease again then. If the output current 6 falls below the upper limit value 20, the overshoot signal R is reset, wherein the control signal Q maintains its state (off). Only when the output current 6 decreases below the lower limit value 19 is the undershoot signal S set and, with it, the control signal Q. After a delay, the switch 7 of the buck converter 3 is closed again, the following charging segment 28 begins and the described sequence begins again.

The resetting of the limit values 19, 20 to the respective base values 21, 22 is likewise associated with the described signals S, R: during resetting of the undershoot signal S, raising of the lower limit value 19 to the lower base value 21 is initiated, wherein this change is only triggered by a delay. The (optional) delay has the effect that the lower limit value 19 is not raised immediately when the lower limit value 19 (changed downward) is overshot and the undershoot signal S is triggered again owing to the output current 6 which is thus below the lower limit value 19. Similarly, the upper limit value 20 (changed upward) is reduced to the upper base value 22 as soon as or shortly after the overshoot signal R is reset. If a delay is used, it is necessary to ensure that the base value 21, 22 is reached before a renewed change to the respective limit value 19, 20 begins, i.e. the lower limit value 19 needs to be raised in good time before overshooting of the upper limit value 20 and the associated (renewed) reduction in the lower limit value 19 begins, and the upper limit value 20 needs to be reduced in good time before an undershoot of the lower limit value 19 and the associated (renewed) raising of the upper limit value 20 begins.

Figure 5:
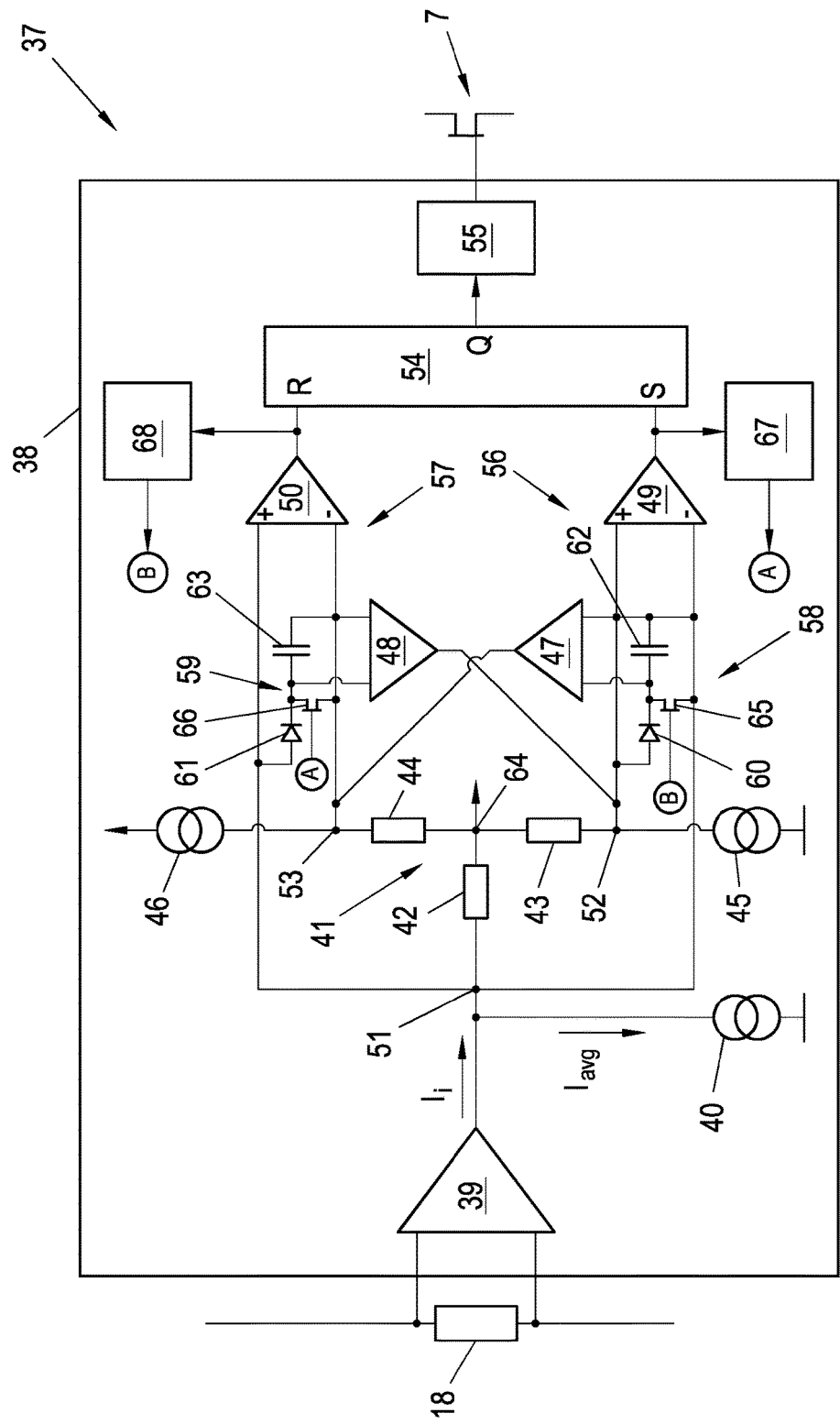
FIG. 5 shows a schematic block circuit diagram of a preferred device for implementing the method illustrated in FIG. 4.

A device 37 designed for implementing the present method is illustrated in FIG. 5 using a schematic block circuit diagram. In this case, a switch 7 of a buck converter 3 (cf. FIG. 1) and a shunt 18, which is connected on the output side to the buck converter 3, are illustrated schematically. The switch 7 is preferably a semiconductor switch, in particular a FET. Both the switch 7 and the shunt 18 are in this case outside an integrated circuit 38 indicated by a border. However, it would likewise be conceivable for the switch 7 and/or the shunt 18 to be included in the integrated circuit 38 in order to simplify installation.

A measuring amplifier 39 is connected to the shunt 18, which belongs to a load circuit (not shown). The measuring amplifier 39 measures the voltage drop across the shunt 18 and therefore indirectly the load or output current 6 of the buck converter 3 which flows via the shunt 18. The measuring amplifier 39 outputs a current Ii which is proportional to the voltage drop across the shunt 18 and therefore proportional to the output current 6. For example, the shunt 18 and the measuring amplifier 39 can be selected such that, in the case of an output current 6 of 1 A, the amplifier 39 outputs a current Ii of 1 mA.

An average current sink 40 is connected to the output of the measuring amplifier 39. The average current sink 40 draws a proportion Iavg of the current Ii output by the measuring amplifier 39, which corresponds to the predefined or desired average output current, of course taking into consideration the scale or the proportionality factor between the output current 6 and the current Ii output by the measuring amplifier 39.

The remaining current (Ii-Iavg) flows via a network 41 of amplifier resistors 42, 43, 44, which connects the output of the measuring amplifier 39 or the average current sink 40 to two half-wave sources 45, 46 or sinks. The amplifier resistors 42, 43, 44 convert the current generated or drawn by the current sources 40, 45, 46 and amplifiers 39, 47, 48 into voltages. The half-wave sources 45, 46 are therefore current sources or current sinks which ensure that the voltage present at the respectively assigned amplifier resistors 43, 44 reproduces the relative position of the measured output current 6 with respect to the respective (lower or upper) limit value 19, 20 (cf. FIG. 4).

Two comparators 49, 50 monitor the voltage between the input 51 of the resistor network 41 (input voltage; likewise referred to below as 51 for simplicity) and in each case one of the two outputs 52, 53 (lower output voltage or upper output voltage; likewise referred to below as 52 or 53 for simplicity). In this case, the comparators 49, 50 are connected to the resistor network 41 with reverse mathematical signs, i.e. the input 51 of the resistor network 41 is at the positive input in the case of the upper comparator 50 and at the negative input in the case of the lower comparator 49. Depending on which of the voltages present at the inputs is higher, the comparators 49, 50 set (in the case of a higher voltage at the positive input) or cancel (in the case of a higher voltage at the negative input) a signal S, R at its output. The outputs of the comparators 49, 50 are connected to an R S flipflop switch 54, wherein the signal from the upper comparator 50 is the overshoot signal R and the signal from the lower comparator 49 is the undershoot signal S. The two signals R, S control the control signal Q occurring at the output of the R S flipflop switch 54 in the manner described in conjunction with FIG. 4: when the undershoot signal S is set, the control signal Q is set and when the overshoot signal R is set the control signal Q is reset. The output of the R S flipflop switch 54 is connected to a gate driver 55, which converts the control signal Q into a voltage suitable for actuating the converter switch 7. The present apparatus 37 therefore determines, on the basis of the control signal Q, the switchover times between charging segments 23, 28 and discharge segments 27, 32 (cf. FIG. 4) of the controlled DC-to-DC converter 3 or of the energy store thereof (for example its inductance).

In each case one compensation circuit 56, 57 is connected to the inputs of the upper comparator 50 and to those of the lower comparator 49. The compensation circuits 56, 57 each comprise a recording circuit 58, 59 and compensation amplifier 47, 48. The recording circuits 58, 59 each have a diode 60, 61 and a storage element in the form of a capacitor 62 and 63, respectively, wherein the diode 60, 61 in both cases is directed in the direction from the positive input of the comparator 49, 50 to the negative input. The capacitor 62, 63 can thus only be charged in each case when the output signal of the respective comparator 49, 50 is set as well. Since the comparators 49, 50, as mentioned above, operate with inverse mathematical signs, the same also applies for the recording circuits 58, 59 or the diodes 60, 61 thereof. Accordingly, the capacitor or minimum-level capacitor 62 of the lower recording circuit 58 is charged if the input voltage 51 decreases below the lower output voltage 52 or the capacitor or maximum-level capacitor 63 of the upper recording circuit 59 is charged if the input voltage 51 increases above the upper output voltage 53. The recording circuits 58, 59 therefore operate as peak rectifiers, which each record the maximum of the voltage achieved in the diode direction on the basis of the charging of the capacitor 62, 63. Precisely in this case in each case the voltage peak minus the forward voltage over the diode 60, 61, which is in each case connected upstream of the capacitor 62, 63, is recorded. The deviation resulting from the diode voltage is mirror-symmetrical, assuming identical diode voltages for the two diodes 60, 61, and therefore increases overall over a full cycle and thus has no influence on the average value of the output current 6. Advantageously, the recording circuits 58, 59 are in addition designed in such a way that the capacitors 62, 63, at least the upper capacitor 63 during runup of the apparatus, i.e. for example during the first half of the first charging segment, is or are not charged.

In each case one compensation amplifier 47, 48 is connected to the capacitors 62, 63 of the recording circuits 58, 59, said compensation amplifier generating a compensation current depending on the voltage present at the associated capacitor 62, 63. The outputs of the compensation amplifiers 47, 48 are connected, crossed-over, to the opposite outputs 53, 52 of the resistor network 41. The upper compensation amplifier 48 connected to the capacitor 63 of the upper recording circuit 59 generates a compensation current, which decreases the lower output voltage 52 in proportion to the charging of the capacitor 63; the lower compensation amplifier 47 connected to the capacitor 62 of the lower recording circuit 58 generates a compensation current which increases the upper output voltage 53 in proportion to the charging of the capacitor 62. The compensation amplifiers 47, 48 are in this case designed in such a way that compensation currents are scaled with matching to the measuring amplifier 39 and the half-wave sources 45, 46.

In the case of an output current 6 which is precisely at the average value, no current flows via the central amplifier resistor 42 and the voltage present at said amplifier resistor disappears. The node 64 connecting the three amplifier resistors 42, 43, 44 is therefore at a potential which corresponds to the preset average value of the output current 6. Starting from this node, a current which corresponds to half the oscillation amplitude (i.e. the upper limit value 20 minus the preset average value) plus a compensation current generated by the lower compensation amplifier 47 flows via the upper amplifier resistor 44. Similarly, but with the inverse mathematical sign with respect to the central node 64, a current which corresponds to half the oscillation amplitude (i.e. the preset average value minus the lower limit value 19) plus a compensation current generated by the upper compensation amplifier 48 flows via the lower amplifier resistor 43.

In order to discharge the capacitors 62, 63, the two recording circuits 58, 59 each have a resetting switch 65, 66. The resetting switches 65, 66, as are the compensation amplifiers 47, 48, are connected on both sides to the respective capacitor 62, 63, with the result that a closed resetting switch 65, 66 discharges the assigned capacitor 62, 63. The control inputs of the resetting switches 65, 66 are each connected to a pulse generator 67, 68, wherein the resetting switch 66 of the upper compensation circuit 57 is connected to a lower pulse generator 67 and the resetting switch 65 of the lower compensation circuit 56 is connected to an upper pulse generator 68 (the connections are denoted by the same letters A, B). The pulse generators 67, 68 are part of the lower or upper compensation circuit 56, 57 and are each connected to the output of the assigned comparator 49, 50 and configured in such a way that they output a pulse signal with a preset width, for example approximately 10 ns, when the comparator signal S, R is reset. Accordingly, when the undershoot signal S is reset, the upper recording circuit 59 is reset or the capacitor 63 thereof is discharged and, when the overshoot signal R is reset, the lower recording circuit 58 is reset or the capacitor 62 thereof is discharged.

As already noted at the outset, the ripple of the output current 6 in the present method is increased in comparison with the use of the constant limit values in favor of a considerably lower discrepancy between the average value and the preset value. However, this effect can be counteracted by the base values 21, 22 of the limit values 19, 20 being matched correspondingly, i.e. the lower base value 21 can be increased correspondingly and the upper base value 22 can be reduced correspondingly, with the result that shorter time intervals between the switchover operations and therefore less ripple are achieved.

The invention claimed is:

1. A method for hysteresis regulation of an output current of a DC-to-DC converter within a hysteresis range having a lower limit value and an upper limit value, the method comprising:

in an event of a departure from the hysteresis range, switching over a switch of the DC-to-DC converter and changing at least one limit value in order to compensate for switching delays;

comparing a quantity dependent on the output current with the lower limit value in a first comparator and comparing a quantity dependent on the output current with the upper limit value in a second comparator to determine whether the output current has exited the hysteresis range; and upon the exit of the output current from the hysteresis range, changing a limit value opposite an exit side symmetrically with the exit in order to achieve an average value of the output current with the hysteresis regulation which is as constant as possible.

2. The method according to claim 1, which comprises, in the event of a departure from the hysteresis range, performing at least one step selected from the group consisting of:
reducing the lower limit value corresponding to an extent of overshooting of the upper limit value; and
raising the upper limit value corresponding to an extent of undershooting of the lower limit value.

3. The method according to claim 1, which comprises recording the extent of overshooting or undershooting in a storage element.

4. The method according to claim 3, wherein the storage element is an associated capacitor.

5. The method according to claim 3, which comprises resetting the storage element periodically, and giving preference to resetting the storage element on renewed entry of the output current into the hysteresis range.

6. The method according to claim 1, which comprises, during a cycle beginning with a decreasing output current within the hysteresis range
a) in the case of undershooting of the lower limit value setting an undershoot signal and causing a closing of the switch of the DC-to-DC converter;
b) during a delay in the switching operation, charging a minimum-level capacitor via a diode corresponding to a difference between the output current and the lower limit value;
c) raising the upper limit value by a value thus achieved of the minimum-level capacitor;
d) maintaining the charge of the minimum-level capacitor after the switching operation and during the subsequent increase in the output current owing to the diode;
e) on overshooting of the lower limit value, resetting an undershoot signal;
f) on overshooting of the upper limit value, setting an overshoot signal and causing an opening of the switch of the DC-to-DC converter;
g) during a delay in the switching operation, charging a maximum-level capacitor via a diode corresponding to the difference between the upper limit value and the output current;
h) reducing the lower limit value by a value thus achieved of the maximum-level capacitor;
i) maintaining the charge of the maximum-level capacitor after the switching operation and during the subsequent reduction in the output current owing to the diode; and
j) on undershooting of the upper limit value, resetting an overshoot signal.

7. The method according to claim 6, which comprises:
e1) on resetting the undershoot signal, causing a discharge of the maximum-level capacitor and raising the lower limit value to an original value; or
j1) on resetting of the overshoot signal, causing a discharge of the minimum-level capacitor and reducing the upper limit value to an original value.

8. A device for hysteresis regulation of an output current of a DC-to-DC converter within a hysteresis range having a lower limit value and an upper limit value, the device comprising:
a measurement device for monitoring the output current of the DC-to-DC converter;
switching devices for switching over a switch of the DC-to-DC converter, said switching devices being configured to signal an overshoot of the upper limit value and an undershoot of the lower limit value;
a compensation circuit connected to a switching device for reducing the lower limit value;
a compensation circuit connected to a switching device for raising the upper limit value;
a first comparator configured for comparing a quantity dependent on the output current with the lower limit value to determine whether the output current has exited the hysteresis range; and
a second comparator configured for comparing the quantity dependent on the output current with the upper limit value to determine whether the output current has exited the hysteresis range;
wherein the device is configured for implementing the method according to claim 1.

9. The device according to claim 8, wherein a respective said compensation circuit has recording circuits respectively assigned to the lower limit value and to the upper limit value.

10. The device according to claim 9, wherein each said recording circuit has a capacitor and a diode connected in series with said capacitor.

11. The device according to claim 10, wherein each said compensation circuit has a compensation amplifier for converting a voltage present at the capacitor of the assigned recording circuit into a current.

12. The device as claimed in claim 10, wherein said the recording circuit has a resetting switch for discharging said capacitor.

13. The device according to claim 12, wherein said resetting switch of said recording circuit assigned to the lower limit value is connected to a switching device for signaling an overshoot of the upper limit value via a pulse generator, and said resetting switch of said recording circuit assigned to the upper limit value is connected to a switching device for signaling an undershoot of the lower limit value via a pulse generator.

14. The device according to claim 13, wherein each said pulse generator is configured to temporarily close a respectively assigned said resetting switch on reentry of the output current into the hysteresis range.

15. The device according to claim 14, wherein said resetting switch is closed after a given time delay.

16. The device according to claim 8, which comprises an average current sink configured to provide a reference value and two substantially identical half-wave sources configured to preset limit values, wherein said average current sink is connected directly to said measurement device and relates a measured output current to the reference value, and wherein said half-wave sources are connected to said measurement device and to said average current sink via voltage-divider resistors, with the result that comparison voltages for identifying an exit of the output current from the hysteresis range are present at the nodes adjacent to said voltage-divider resistors.

17. The device according to claim 8, wherein said measurement device and said switching devices, including said compensation circuits are accommodated in an integrated circuit.

18. The device according to claim 17, wherein said integrated circuit further includes a shunt for measuring a current across the DC-to-DC converter and a switch for switching off/on a voltage at a converter inductance.

19. The device according to claim 18, wherein said switch is a FET.

20. The device according to claim 17, wherein said integrated circuit further includes a shunt for measuring a current across the DC-to-DC converter or a switch for switching off/on a voltage at a converter inductance.

\* \* \* \* \*